Aug. 21, 1951 WEN YUAN PAN 2,565,261

PERMEABILITY TUNING SYSTEM FOR SUPERHETERODYNE RECEIVER

Filed Sept. 11, 1948 2 Sheets-Sheet 1

INVENTOR
WEN YUAN PAN
BY
ATTORNEY

Aug. 21, 1951 | WEN YUAN PAN | 2,565,261

PERMEABILITY TUNING SYSTEM FOR SUPERHETERODYNE RECEIVER

Filed Sept. 11, 1948 | 2 Sheets-Sheet 2

INVENTOR
WEN YUAN PAN
BY Philip B. Cooper
ATTORNEY

Patented Aug. 21, 1951 2,565,261

UNITED STATES PATENT OFFICE 2,565,261

PERMEABILITY TUNING SYSTEM FOR SUPERHETERODYNE RECEIVER

Wen Yuan Pan, Collingswood, N. J., assignor to Radio Corporation of America, a corporation of Delaware Application September 11, 1948, Serial No. 48,885

6 Claims. (Cl. 250—40)

This invention relates generally to permeability tuners and particularly to permeability tuned signal frequency and oscillator inductors for a superheterodyne receiver designed in such a manner as to obtain more perfect tracking.

It is conventional practice to provide permeability tuned signal frequency and oscillator tank circuits for a superheterodyne receiver. A permeability tuned circuit includes an inductor having a winding and a paramagnetic core, the movement of which will vary the resonant frequency of the circuit. A paramagnetic material is defined as a material having a magnetic permeability greater than that of a vacuum, which is unity. The magnetic permeability of a paramagnetic material may be independent of the magnetizing force or it may vary with the magnetizing force, in which case the material is called ferromagnetic. In a superheterodyne receiver it is necessary that the difference between the oscillator frequency and the signal frequency remain constant throughout the desired tuning range. This is conventionally called tracking of the oscillator and signal frequency circuits.

A permeability tuner is usually designed by first choosing the dimensions and electrical characteristics of the signal frequency inductor. The signal frequency inductor is designed so that the desired relationship between the core positions and the resulting resonant frequencies of the signal frequency circuit may be obtained. In many cases it is desired that this relation be approximately linear. After the design of the the signal frequency inductor has been determined another inductor must be designed for the oscillator tank circuit which will track with the signal frequency inductor. This is conventionally done by trial and error and the resulting tracking is not too perfect. Usually the tracking is only correct near the two ends of the frequency range to be covered and between these ends there exists a certain tracking error. Thus, two-point tracking only can be achieved. Furthermore, whenever a new receiver is designed which may necessitate changes in the frequency range to be covered or in the electrical characteristics or dimensions of one of the inductors. the whole procedure must be repeated. It has not been possible heretofore to calculate the electrical properties of an oscillator inductor which will track with a given signal frequency inductor.

It is the principal object of the invention, therefore, to provide a permeability tuner for a superheterodyne receiver which will give better tracking over the desired frequency range and which will give more than two tracking points.

A further object of the present invention is to provide a permeability tuner for a superheterodyne receiver where the electrical characteristics of one of the inductors, such as the signal frequency inductor, may be chosen at will while the electrical characteristics of the other inductor, which may be the oscillator inductor, can be determined mathematically to provide for a constant difference between the oscillator frequency and the signal frequency throughout the desired frequency range.

Another object of the invention is to provide a signal frequency inductor and an oscillator inductor for a superheterodyne receiver having windings of substantially equal length and like pitch but of different diameters chosen to obtain tracking of the permeability tuner.

A permeability tuner for a superheterodyne receiver conventionally comprises a signal frequency circuit having a signal frequency coil and an oscillator tank circuit having an oscillator coil. The two circuits are tuned by two paramagnetic cores associated with the two coils and movable in unison. In accordance with the present invention, the diameters of the windings of the two coils are chosen in such a manner that for each position of the cores with respect to the windings the difference between the oscillator frequency and the signal frequency is substantially constant throughout the predetermined range of movement of the cores. The diameter of the oscillator winding will be smaller than that of the signal frequency winding. The two windings preferably are of substantially equal length and have like pitch, which may be uniform or non-uniform. The diameters of the two windings are determined mathematically in accordance with the present invention.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
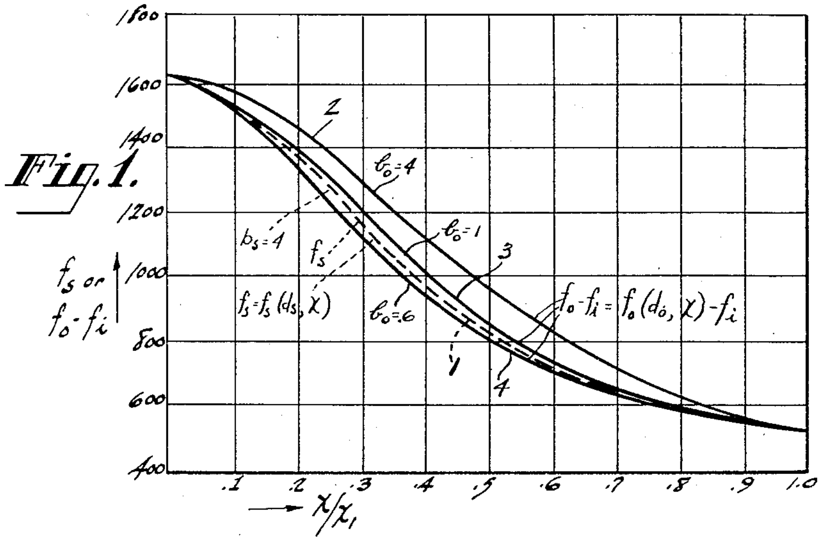
Figs. 1 and 2 are graphs which will be referred to in explaining the principles of the present invention.

Referring now to the drawings, the mathematical basis of the invention will first be explained by reference to the curves of Figs. 1 and 2. In order to obtain perfect tracking in a superheterodyne receiver, the difference between the oscillator frequency $f_o$ and the signal frequency $f_s$ at any tuning position should be equal to the intermediate frequency $f_i$ or $$f_o - f_s = f_i \qquad (1)$$

In a permeability tuning system the oscillator frequency $f_o$ depends principally upon the displacement of the core of the oscillator winding, upon the material of the core and the physical dimensions of the winding and of the core. This relation may be expressed by the following empirical formula:

$$f_o = \frac{f_2 + f_i}{\sqrt{1 + \dfrac{a_o\left(\dfrac{X}{X_1}\right)^2}{b_o + \left(\dfrac{X}{X_1}\right)^{3/2}} \dfrac{1}{\sqrt{1 + \frac{1}{2}\left(\dfrac{X}{X_1}\right)^5}}}} \qquad (2)$$

where $$a_o = \frac{K_o}{L_o} \quad d_o^{.64} \quad e_o^{2.11} \quad n_o^2 X_1^{.5}$$

and $$b_o = 24.4 \frac{(d_o)^{3/2}}{(\lambda_o)}$$

In discussing the above formulas $f_1$ is the lowest signal frequency of the range to be covered and which is 540 kilocycles (kc.) for the conventional broadcast band while $f_2$ is the highest signal frequency of the range to be covered and is 1620 kc. for the conventional broadcast band. X is the core displacement in inches from a reference point and $X_1$ is the maximum core displacement in inches. Constants $a_o$ and $b_o$ are related to $f_1$ and $f_2$ and are determined by the electrical characteristics and dimensions of the oscillator inductor. Furthermore, $K_o$ is a constant, $L_o$ is the inductance of the oscillator inductor with the core removed, $d_o$ is the diameter of the oscillator winding in inches, $e_o$ is the diameter of the oscillator core in inches and $n_o$ is the pitch of the winding in turns per inch. Finally, $\lambda_o$ is the length of the oscillator winding in inches.

Equations 1 and 2 may be solved for $a_o$ as follows:

$$a_o = \left[\left(\frac{f_2 + f_i}{f_s + f_i}\right)^2 - 1\right] \frac{b_o + \left(\dfrac{X}{X_1}\right)^{3/2}}{\left(\dfrac{X}{X_1}\right)^2} \sqrt{1 + \frac{1}{2}\left(\frac{X}{X_1}\right)^5} \qquad (3)$$

We may assume that the inductor of the signal frequency circuit has fixed or given dimensions and electrical characteristics. Accordingly, the signal frequency $f_s$ may be measured experimentally as a function of $X/X_1$, the relative core displacement. Alternatively, the signal frequency $f_s$ may be calculated in accordance with the following formula:

$$f_s = \frac{f_2}{\sqrt{1 + \dfrac{a_s\left(\dfrac{X}{X_1}\right)^2}{b_s + \left(\dfrac{X}{X_1}\right)^{3/2}} \dfrac{1}{\sqrt{1 + \frac{1}{2}\left(\dfrac{X}{X_1}\right)^5}}}} \qquad (4)$$

In the above formula $a_s$ and $b_s$ correspond to $a_o$ and $b_o$ as defined previously, it being understood that the constants of the signal frequency inductor are to be substituted. Thus, for determining $a_s$ and $b_s$ the dimensions of the signal frequency inductor must be taken for $d_s$, $e_s$, $n_s$, $K_s$, $L_s$, and $\lambda_s$.

In order to provide proper tracking with a given signal frequency inductor Equation 1 must be satisfied for any particular tuning position by properly choosing the values of $a_o$ and $b_o$ in Equation 2. Thus, the values of $f_i$, $f_1$ and $f_2$ which are governed by the particular broadcast band to be received and by the receiver design, must be determined. Thereafter, $f_s$ may be determined from Equation 4 for any given signal frequency inductor. From Equations 2 and 3 $a_o$ has to be eliminated and the value for $b_o$ must be chosen so that Equation 1 is fulfilled. In other words, we may assume that the signal frequency $f_s$ is a function of $d_s$, the diameter of the signal frequency winding and of X, the core position. Thus, $$f_s = F_s(d_s, X)$$

In the same manner, we may assume that the oscillator frequency $f_o$ is a function only of $d_o$, the diameter of the oscillator winding and of X, the core position. Accordingly, $f_o = F_o(d_o, X)$. Consequently, all that needs to be done is to satisfy the following equation:

$$f_o - f_s = F_o(d_o, X) - F_s(d_s, X) = f_i \qquad (5)$$

It is, of course, to be understood that when $d_o$ is varied both $b_o$ and $a_o$ will change accordingly. The procedure required for satisfying the condition of Equation 5 can be considerably simplified by putting $\lambda_s = \lambda_o$ and $n_s = n_o$. In other words, the length of both the oscillator and the signal frequency windings should be equal and both windings should have like pitch. It will furthermore be obvious that the oscillator inductor may first be chosen and that thereafter the diameter of the winding of the signal frequency inductor may be determined by Equation 5.

In the following table values of $a_s$ and $b_s$ are given for $f_1 = 540$ kc. and $f_2 = 1620$ kc.

| "$b_s$" $= 24.4 \frac{(d_s)^{3/2}}{X_1}$ | $\frac{X_1}{d_s}$ | "$a_s$" | |
|---|---|---|---|
| | | $f_i = 455$ kc. | $f_i = 260$ kc. |
| 1.5 | 6 42 | 10.13 | 13.68 |
| 2 | 5.30 | 12.16 | 16.42 |
| 3 | 4.05 | 16.21 | 21.89 |
| 5 | 2.55 | 24.31 | 32.83 |
| 10 | 1 81 | 44.57 | 60.19 |
| 20 | 1.14 | 81.1 | 114.92 |

For the calculations on which the above table is based it has further been assumed that $X_1 = \lambda_s$, that is, the maximum core displacement equals the length of the oscillator winding.

Referring now to Fig. 1, there is plotted the relative core displacement $X/X_1$ against the signal frequency $f_s$ or against $f_o - f_i$ for the oscillater circuit. When Equations 1 or 5 are satisfied, the two curves obtained by plotting the resonant frequency of the signal frequency coil for each core position and by plotting the difference of the resonant frequency of the oscillator circuit less the intermediate frequency for each position of the oscillator core should coincide. Thus, dotted curve 1 of Fig. 1 shows the resonant frequency of the signal frequency circuit for a given signal frequency inductor having a $b_s$ of 4. Curve 1 accordingly represents $f_s = F_s(d_s, X)$. Curve 2 has been obtained by assuming $b_o = 4$. Curve 2 represents the formula $f_o-f_i=F_o(d_o, X)-f_i$. Curves 3 and 4 have been obtained with values for $b_o$ of 1 and .6 respectively. It will be seen that a value of $b_o$ which is somewhere between 1 and .6 will give an oscillator circuit which will track perfectly with the given signal frequency circuit. In this case, the signal frequency winding has a uniform pitch but it is to be understood that the winding of the signal frequency inductor need not be uniform.

Figure 2:
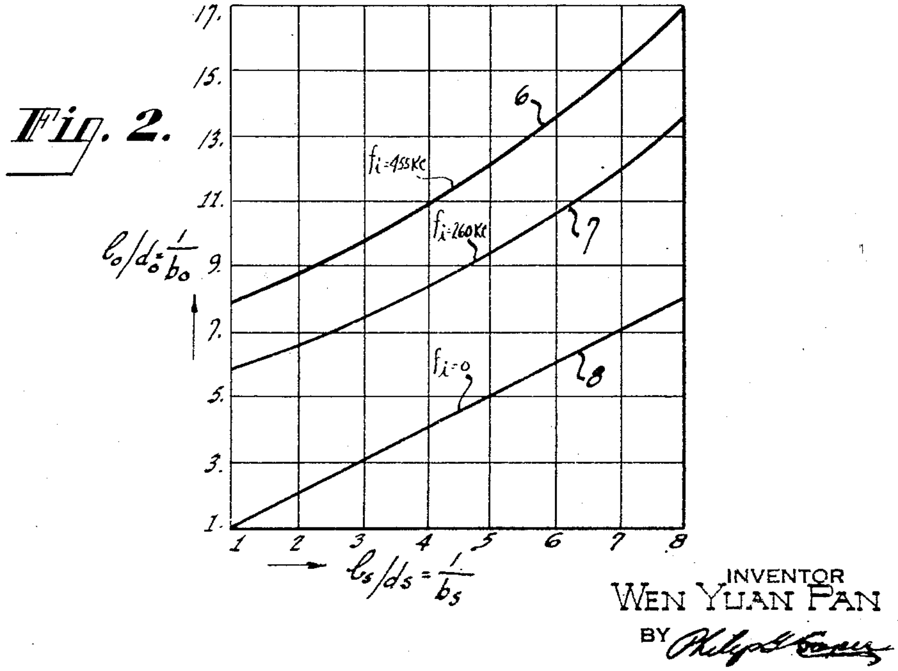

Fig. 2 shows a set of curves where the ratio $\lambda_s/d_s$, which is inversely proportional to $b_s$, is plotted against ratio $\lambda_o/d_o$ which in turn is inversely proportional to $b_o$. Thus, curve 6 of Fig. 2 gives the two ratios for an intermediate frequency $f_i=455$ kc. Curve 7 is plotted for $f_i=260$ kc. Finally, curve 8 has been plotted for $f_i=0$. From this curve 8 the relationship of the said ratios is $\lambda_s/d_s=\lambda_o/d_o$, that is, the two inductors have equal dimensions and electrical characteristics. From the curves of Fig. 2 and for a given ratio of length to diameter of the signal frequency inductor the corresponding ratio of length to diameter of the oscillator inductor can be determined. It is also feasible to utilize a signal frequency inductor having a winding of non-uniform pitch. Fig. 2 is only illustrative of the ratios $\lambda_s/d_s$ and $\lambda_o/d_o$ for the broadcast band. If $f_1$, $f_2$ and $f_i$ are different, the ratios of $\lambda_s/d_s$ and $\lambda_o/d_o$ may be found by means of the above formulas.

Figure 3:
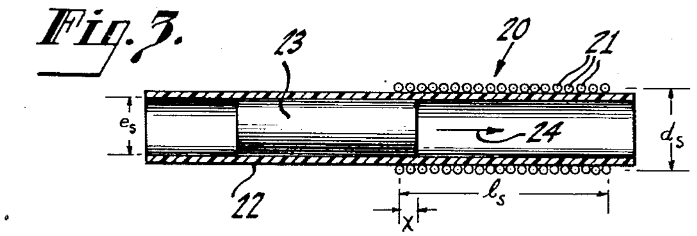
Fig. 3 is an elevational view, partly in section, of a signal frequency inductor.
Figure 4:
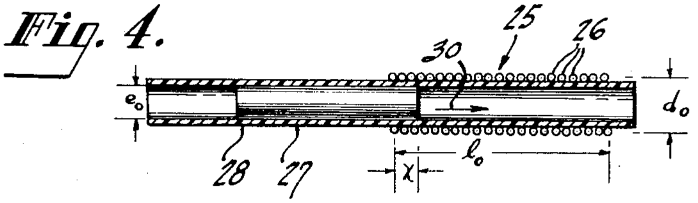
Fig. 4 is an elevational view, partly in section, of an oscillator inductor embodying the present invention.

Fig. 3 illustrates inductor 20 for the signal frequency circuit of a superheterodyne receiver. Inductor 20 consists of winding 21 which may be wound on an insulating cylindrical form 22. Paramagnetic core 23 is arranged to be slidable axially within cylindrical form 22 in the direction of arrow 24. The dimensions $d_s$, $\lambda_s$, $e_s$ and X have been shown in Fig. 3. Fig. 4 illustrates inductor 25 which may be used in the tank circuit of the local oscillator of the receiver. Inductor 25 also consists of a winding 26 wound on insulating cylindrical form 27. Paramagnetic core 28 is arranged to slide within form 27 in the direction of arrow 30. The dimensions of oscillator inductor 25 such as $d_o$, $\lambda_o$, $e_o$ have been indicated in Fig. 4. It will be noted that the diameter $d_o$ of oscillator winding 26 is less than the diameter $d_s$ of signal frequency winding 21.

Figure 5:
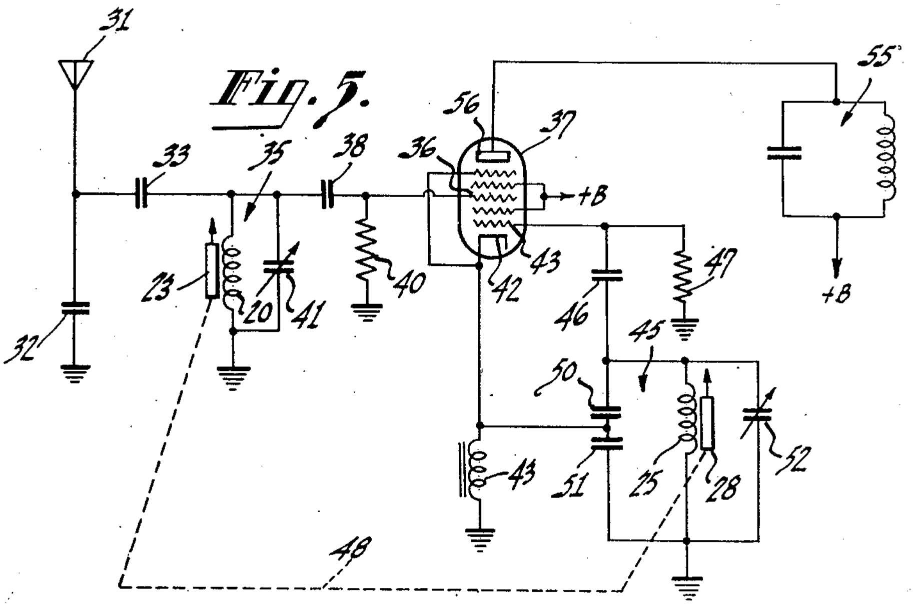
Fig. 5 is a circuit diagram of a portion of a superheterodyne receiver in accordance with the present invention.

Fig. 5 shows the circuit diagram of a portion of a superheterodyne receiver in accordance with the invention. A modulated carrier wave may be intercepted by antenna 31 coupled to ground through capacitor 32. Capacitor 33 couples the antenna to signal frequency input circuit 35 and control grid 36. Capacitors 32 and 33 serve the purpose of matching the impedance of antenna 31 to that of signal frequency circuit 35 and of control grid 36.

Signal frequency circuit 35 is coupled to control grid 36 of pentagrid converter tube 37 through coupling capacitor 38. Control grid 36 is returned to ground through grid leak resistor 40. Signal frequency circuit 35 consists of inductor 20 of Fig. 3 including core 23 illustrated schematically. Inductor 20 has one terminal connected to ground while its other terminal is coupled to control grid 36. The inductor is shunted by trimmer capacitor 41 which may be adjustable as shown to adjust the upper frequency of resonant circuit 35.

The oscillator portion of pentagrid converter tube 37 includes cathode 42 and control grid 43. Cathode 42 is connected to ground through choke coil 43. Oscillator tank circuit 45 is coupled to control grid 43 through coupling capacitor 46. Control grid 43 is returned to ground through grid leak resistor 47.

Oscillator tank circuit 45 includes inductor 25 of Fig. 4 with core 28. Cores 23 and 28 are connected for unicontrol operation as indicated at 48. One terminal of inductor 25 is connected to ground while its other terminal is coupled to control grid 43 through coupling capacitor 46. Inductor 25 is shunted by capacitors 50 and 51 arranged in series. Inductor 25 may also be shunted by trimmer capacitor 52 for adjusting the upper frequency of tank circuit 45. The junction point of capacitors 50 and 51 is connected to cathode 42.

Oscillator tank circuit 45 is arranged in the manner of a Colpitts oscillator and its operation is too well known to require further explanation. The two screen grids of tube 37 are connected to a suitable source of voltage indicated at +B. The intermediate frequency wave may be derived from output circuit 55 having one terminal connected to voltage source +B and its other terminal to anode 56.

For a given signal frequency inductor 20 the diameter of the winding 26 of oscillator inductor 25 may be determined in the manner previously pointed out. With the permeability tuner of the present invention almost perfect tracking may be achieved for any given signal frequency inductor 20. In particular, more than two tracking points can easily be obtained.

There has thus been described a permeability tuner for a superheterodyne receiver where the dimensions and electrical characteristics of the oscillator inductor can be mathematically determined for any given signal frequency inductor so as to obtain tracking. The two inductors preferably are of equal length and have like pitches. By simply choosing the right diameter of the oscillator inductor, multiple point tracking may be obtained.

It may be necessary to reduce the tuning range of the oscillator inductor. This may be done in any conventional manner, for example, by providing the oscillator inductor with an auxiliary winding connected in series or in parallel to the oscillator inductor and not magnetically coupled thereto in the manner taught in the patent to Koch 2,389,986 of November 27, 1945. It is also feasible to reduce the tuning range of the oscillator inductor by using a paramagnetic core for the oscillator inductor which has a smaller permeability than that of the signal frequency inductor. This has, for example, been suggested in the patent to Kreienfeld 2,276,617 of March 17, 1942.

I claim:

1. In a superheterodyne receiver, a signal frequency circuit having a signal frequency coil, an oscillator tank circuit having an oscillator coil, a paramagnetic core movable within the magnetic field of each of said coils, means for moving said cores in unison with respect to said coils to vary simultaneously the signal frequency $f_s$ and the oscillator frequency $f_o$, said coils having windings of substantially like pitch, the diameter $d_s$ of said signal frequency coil and the diameter $d_o$ of said oscillator coil being related by the equation $f_o-f_s=F_o(d_o, X)-F_s(d_s, X)=f_i$, where $f_i$ is the desired intermediate frequency, $F_o(d_o, X)=f_o$ is a function of the diameter of said oscillator coil and the position X of its associated core and where $F_s(d_s, X)=f_s$ is a function of the diameter of said signal frequency coil and the position X of its associated core.

2. In a superheterodyne receiver, a signal frequency circuit having a signal frequency coil, an oscillator tank circuit having an oscillator coil, a paramagnetic core movable within the magnetic field of each of said coils, means for moving said cores in unison with respect to said coils to vary simultaneously the signal frequency $f_s$ and the oscillator frequency $f_o$, said coils being of substantially equal length, the diameter $d_s$ of said signal frequency coil and the diameter $d_o$ of said oscillator coil being related by the equation $f_o-f_s=F_o(d_o, X)-F_s(d_s, X)=f_i$, where $f_i$ is the desired intermediate frequency, $F_o(d_o, X)=f_o$ is a function of the diameter of said oscillator coil and the position X of its associated core and where $F_s(d_s, X)=f_s$ is a function of the diameter of said signal frequency coil and the position X of its associated core.

3. In a superheterodyne receiver, a signal frequency circuit having a signal frequency coil, an oscillator tank circuit having an oscillator coil, a paramagnetic core movable within the magnetic field of each of said coils, means for moving said cores in unison with respect to said coils to vary simultaneously the signal frequency $f_s$ and the oscillator frequency $f_o$, said coils being of substantially equal length and having windings of substantially like pitch, the diameter $d_s$ of said signal frequency coil and the diameter $d_o$ of said oscillator coil being related by the equation $$f_o-f_s=F_o(d_o, X)-F_s(d_s, X)=f_i$$

where $f_i$ is the desired intermediate frequency, $F_o(d_o, X)=f_o$ is a function of the diameter of said oscillator coil and the position X of its associated core and where $F_s(d_s, X)=f_s$ is a function of the diameter of said signal frequency coil and the position X of its associated core.

4. In a superheterodyne receiver, a signal frequency circuit including a first inductor, an oscillator tank circuit including a second inductor, said inductors having windings and paramagnetic cores respectively movable within the magnetic field of said windings, means for moving said cores in unison with respect to their associated windings, said coils having windings of substantially like pitch, the diameters of said windings being related in a ratio wherein the diameter of the second inductor is smaller than the diameter of the first inductor whereby for each position of said cores with respect to said windings the difference between the oscillator frequency and the signal frequency is substantially constant throughout a predetermined range of movement of said cores with respect to said windings.

5. In a superheterodyne receiver, a signal frequency circuit including a first inductor, an oscillator tank circuit including a second inductor of smaller diameter than said first inductor, said inductors having windings and paramagnetic cores respectively movable within the magnetic field of said windings, means for moving said cores in unison with respect to their associated windings, whereby for each position of said cores with respect to said windings the difference between the oscillator frequency and the signal frequency is substantially constant throughout a predetermined range of movement of said cores with respect to said windings.

6. In a receiver, a signal frequency circuit including a first inductor, a second signal frequency circuit including a second inductor of smaller diameter than said first inductor, said inductors having windings and paramagnetic cores respectively movable within the magnetic field of said windings, means for moving said cores in unison with respect to their associated windings, said windings being of substantially the same length and pitch whereby for each position of said cores with respect to said windings the difference between the frequencies of said circuits is substantially constant throughout a predetermined range of movement of said cores with respect to said windings.

WEN YUAN PAN.

REFERENCES CITED

The following references are of record in the file of this patent:

UNITED STATES PATENTS

| Number | Name | Date |
|---|---|---|
| 2,248,242 | Landon | July 8, 1941 |
| 2,363,101 | Van Der Heem | Nov. 21, 1944 |
| 2,417,182 | Sands | Mar. 11, 1947 |
| 2,496,058 | Mackey | Jan. 31, 1950 |